(12) United States Patent
Luce

(10) Patent No.: US 9,762,382 B1
(45) Date of Patent: Sep. 12, 2017

(54) TIME-ALIGNING A SIGNAL

(71) Applicant: Teradyne, Inc., North Reading, MA (US)

(72) Inventor: Lawrence B. Luce, Sun Lakes, AZ (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 15/046,686

(22) Filed: Feb. 18, 2016

(51) Int. Cl.
*H04L 7/02* (2006.01)

(52) U.S. Cl.
CPC ...................................... *H04L 7/02* (2013.01)

(58) Field of Classification Search
CPC ....................................................... H04L 7/02
See application file for complete search history.

(56) References Cited

U.S. PATENT DOCUMENTS

| | | | | |
|---|---|---|---|---|
| 5,631,610 | A * | 5/1997 | Sandberg ................ | H03C 1/60 329/357 |
| 2006/0099919 | A1* | 5/2006 | Sorrells ................... | H03C 5/00 455/127.1 |
| 2006/0176965 | A1 | 8/2006 | Furman et al. | |
| 2006/0241915 | A1* | 10/2006 | Woodward ........... | G01R 13/345 702/189 |
| 2007/0124141 | A1* | 5/2007 | You ....................... | G10L 19/025 704/230 |
| 2009/0304198 | A1* | 12/2009 | Herre ..................... | G10L 19/008 381/66 |
| 2011/0013433 | A1 | 1/2011 | Wagoner et al. | |
| 2013/0077805 | A1* | 3/2013 | Kirsch ................. | G11B 27/105 381/119 |
| 2013/0099582 | A1 | 4/2013 | Ray et al. | |
| 2015/0207975 | A1 | 7/2015 | Nguyen et al. | |
| 2015/0241869 | A1* | 8/2015 | Tezuka ................. | G05B 19/408 700/73 |
| 2015/0261343 | A1* | 9/2015 | Leigh .................. | G06F 3/03545 345/173 |

FOREIGN PATENT DOCUMENTS

KR  2014-0013465 A  2/2014

OTHER PUBLICATIONS

International Search Report for PCT/US2016/063012, 3 pages (Mar. 10, 2017).
Written Opinion for PCT/US2016/063012, 7 pages (Mar. 10, 2017).

* cited by examiner

*Primary Examiner* — Jean D Corrielus
(74) *Attorney, Agent, or Firm* — Choate, Hall & Stewart LLP; Paul Pysher

(57) ABSTRACT

An example method includes: obtaining sinusoidal signals comprising components of a first time-domain signal; shifting phases of the sinusoidal signals by amounts corresponding to a specified time-shift to produce phase-shifted signals, and converting the phase-shifted signals to the time domain to produce time-shifted signals. The shifting may be performed to more closely align an envelope of the first time-domain signal with an envelope of a second time-domain signal.

21 Claims, 14 Drawing Sheets

TIME-ALIGNING A SIGNAL

TECHNICAL FIELD

This specification relates generally to time-aligning signals, such as a time-domain signal and a variable power signal.

BACKGROUND

In various applications, it is often beneficial to align two or more signals as closely in time as possible. For example, communication signals may have a relatively low average amplitude, but may contain crests that require higher than average power. FIG. 1 shows an example communication 100 signal (or, waveform); and FIG. 2 shows an amplitude of communication signal 100 having such crests 101. The amplitude of the signal is used as a proxy for its total instantaneous power requirements.

Referring to FIGS. 3 and 4, a fixed power supply providing constant power 104 that exceeds crests 101 results in considerable wasted power 105, making such a system inefficient. Accordingly, variable power supplies may be used to produce variable power that attempts to track the amplitude of the communication signal. For example, referring to FIG. 5, a variable power signal 106 may be generated by a variable power supply so that the power signal's envelope (e.g., the contours of the signal) tracks the envelope of the amplitude of communication signal 101. Misalignment between envelopes of signals 101 and 106, as shown in FIG. 6, can result in wasted power 107, leading to inefficiency.

Applications other than power management also benefit from alignment of two or more time-domain signals.

SUMMARY

An example method comprises: obtaining sinusoidal signals comprising components of a first time-domain signal; shifting phases of the sinusoidal signals by amounts corresponding to a specified time-shift to produce phase-shifted signals; and converting the phase-shifted signals to time domain signals having the specified time-shift. The example method includes one or more of the following features, either alone or in combination.

Obtaining the sinusoidal signals may comprise performing a frequency-domain analysis of the first time-domain signal. The frequency-domain analysis may comprise one of a discrete Fourier transform, a Galois transform, a Cosine transform, or a ChirpZ transform. The shifting may be performed to more closely align an envelope of the first time-domain signal with an envelope of a second time-domain signal. Obtaining the sinusoidal signals may comprise performing a fast Fourier transform of the first time-domain signal to produce the sinusoidal signals; the second time-domain signal may comprise a variable power signal produced by a variable power supply; and converting may comprise performing an inverse fast Fourier transform on the phase shifted signals to produce a third time-domain signal having an envelope that tracks the envelope of the variable power signal more closely than does the envelope of the first time-domain signal resulting in a reduction of wasted power from the variable power supply.

Shifting phases of the sinusoidal signals by amounts corresponding to a specified time-shift may comprise delaying the phases of the sinusoidal signals by the amounts. Shifting phases of the sinusoidal signals by amounts corresponding to a specified time-shift may comprise advancing the phases of the sinusoidal signals by the amounts.

The sinusoidal signals may comprise a first harmonic and harmonics, with each harmonic being an integer times a frequency of the first harmonic. For each harmonic, a phase-shift may comprise a phase-shift of the first harmonic times the integer.

The sinusoidal signals may be associated with bins, each of which may have a bin number. A phase-shift for a sinusoidal signal may comprise a product of two, pi, the time-shift, and the bin number divided by a total period of the first time-domain signal.

A Fourier frequency of the time-domain signal is an inverse of an acquisition time of the time-domain signal. Shifting phases of the sinusoidal signals may comprise: generating a ramp function having a slope that corresponds to a phase delay of the Fourier frequency, with the ramp function comprising steps in which each step of the ramp function corresponds to a product of the bin number and the phase delay; and combining the ramp function with phases of the sinusoidal signals to produce the phase-shifted signals. Each step may have an equal length.

The first time-domain signal has an associated sample clock period; and the time-shift may be less than the sample clock period, or the time-shift may be more than the sample clock period.

The sinusoidal signals may be two, or more than two, signals. The first time-domain signals may be generated by a first waveform generator. The second time-domain signals may be generated by a second waveform generator.

The first time-domain signal may pass through a different electrical pathway than the second time-domain signal resulting in a difference between the envelope of the first time-domain signal and the envelope of the variable power signal that is mitigated by the shifting.

One or more non-transitory machine-readable storage devices store instructions that are executable by one or more processing devices to perform operations comprising: obtaining information representing sinusoidal signals comprising components of a first time-domain signal; processing the information to shift phases of the sinusoidal signals by amounts corresponding to a specified time-shift to produce information representing phase-shifted signals; and processing the information representing the phase-shifted signals to produce information representing time domain signals having the specified time-shift.

A system may comprise one or more processing devices; and one or more non-transitory machine-readable storage devices storing instructions that are executable by the one or more processing devices to perform operations comprising: obtaining information representing sinusoidal signals comprising components of a first time-domain signal; processing the information to shift phases of the sinusoidal signals by amounts corresponding to a specified time-shift to produce information representing phase-shifted signals; and processing the information representing the phase-shifted signals to produce information representing time domain signals having the specified time-shift.

Any two or more of the features described in this specification, including in this summary section, can be combined to form implementations not specifically described herein.

The systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein.

The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

Described herein are example techniques for time-shifting signals, including delaying the signals by a specified amount or advancing the signals by a specified amount. The techniques include obtaining sinusoidal signals comprising components of a first time-domain signal, and shifting phases of the sinusoidal signals by amounts corresponding to the specified time-shift to produce signals having a phase shift that corresponds to the time shift. The resulting signals may be converted to time-domain signals that are shifted in time by an amount of the time shift. The techniques may be used to time-shift any single signal or any number of multiple signals (e.g., two, three, four, five, etc. signals) for any appropriate purpose.

In the examples described herein, the techniques are used to align signals in time. For example, the techniques may be used to improve alignment of a variable power signal and the amplitude of a communication signal. However, as noted above, the techniques are not limited to use in this context. In some implementations, alignment includes aligning the envelopes (e.g., signal contours) of a variable power signal and the amplitude of a communication (e.g., radio frequency, or RF) signal to reduce the difference in time between the two. By improving alignment of the variable power signal and the RF amplitude, the amount of power wasted can be reduced. In some situations, as a result, the size of the supply used to generate the variable power signal can be reduced. In some situations, excess power resulting from reduced waste can be diverted to other electronics either in test or operational equipment. In some situations, reduced cost of electrical utility services may be obtained. In some situations, longer battery life before recharge or replacement is required may be obtained.

Figure 1:
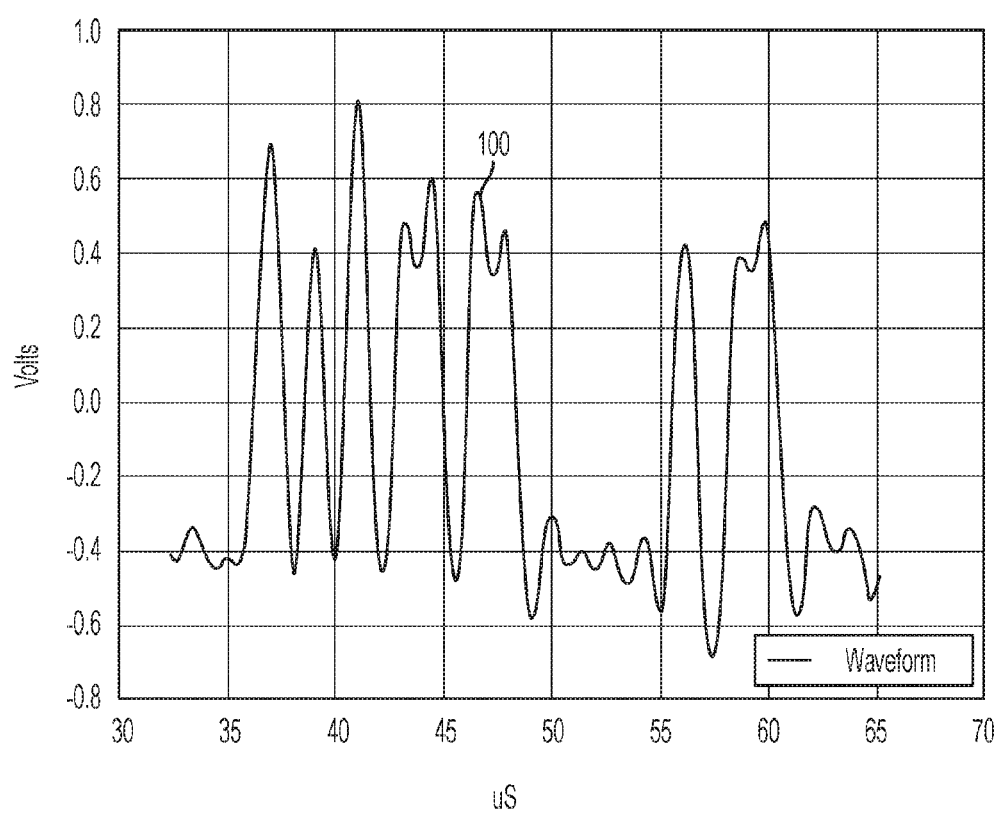
FIG. 1 is a graph showing an example time-domain signal.
Figure 2:
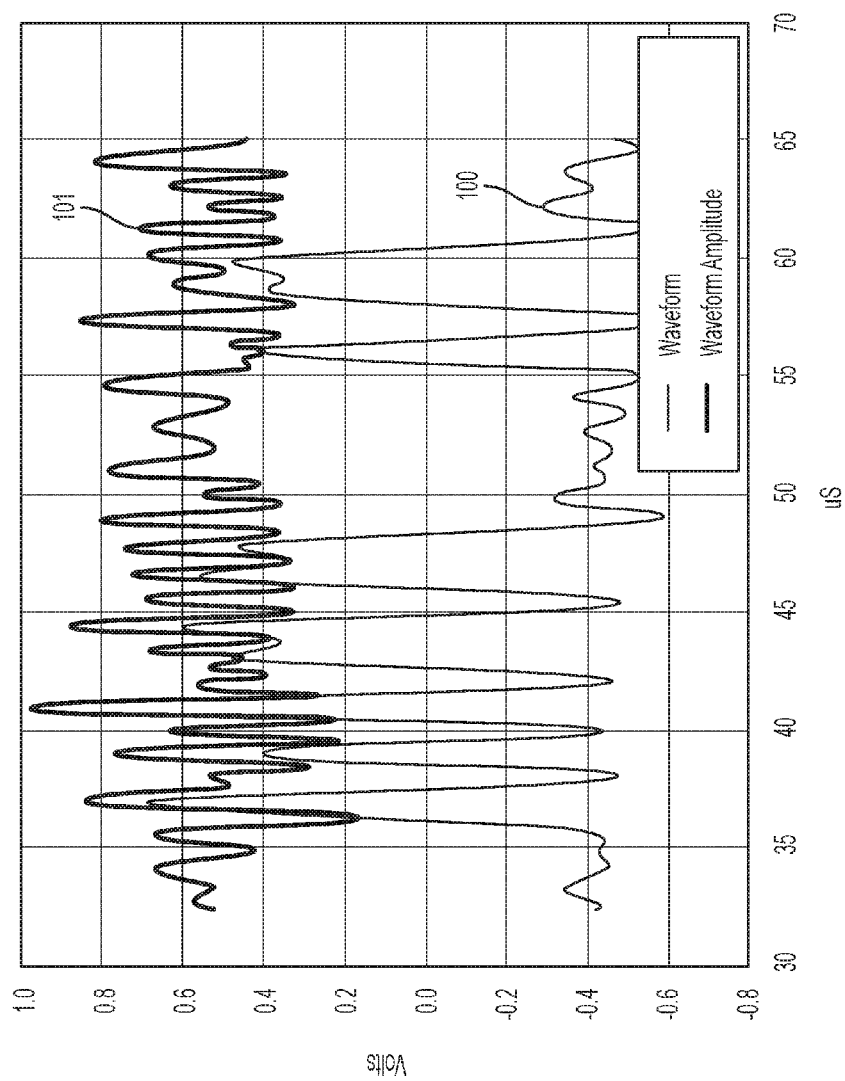
FIG. 2 is a graph showing the magnitude of the time-domain signal of FIG. 1.
Figure 3:
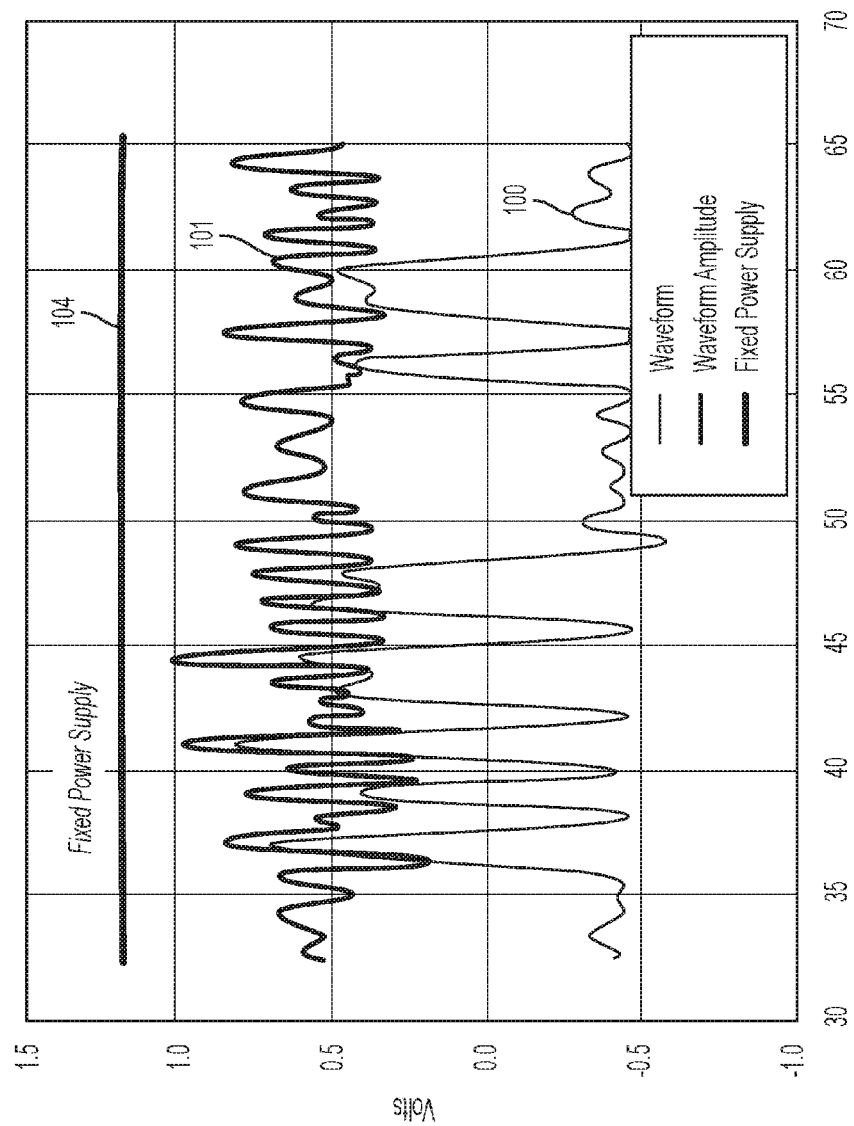
FIG. 3 is a graph showing a fixed power supply signal relative to the magnitude and time-domain signal of FIG. 2.
Figure 4:
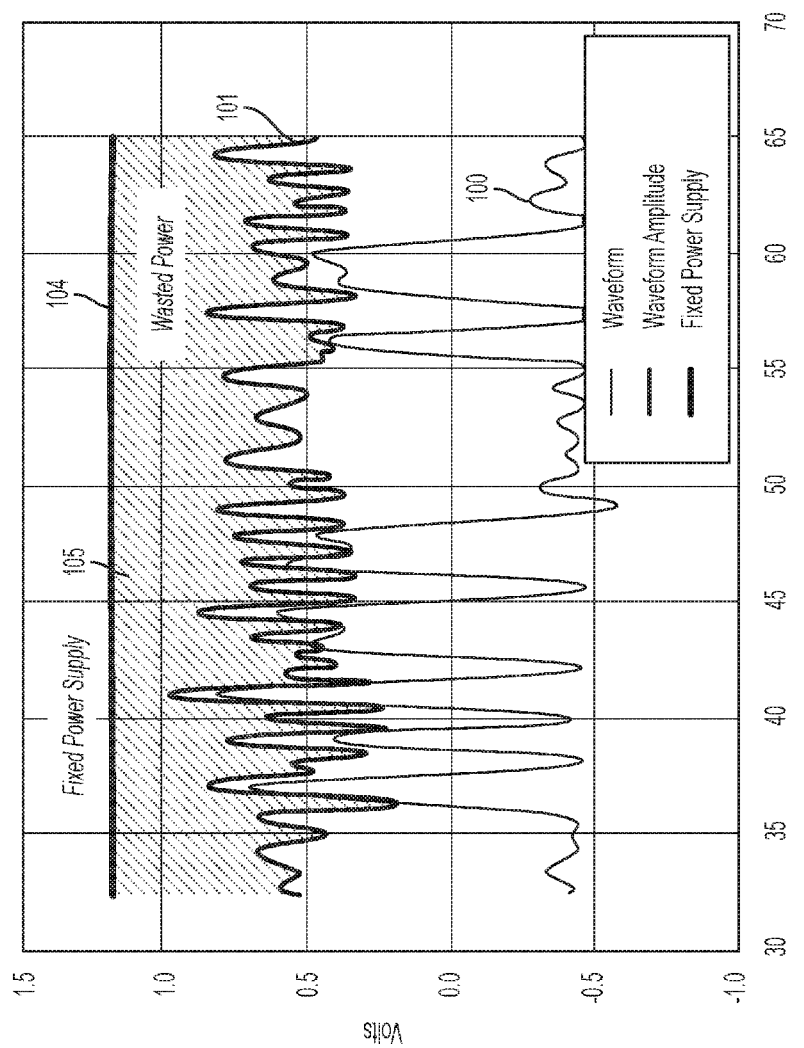
FIG. 4 is graph showing wasted power resulting from the fixed power supply signal of FIG. 3.
Figure 5:
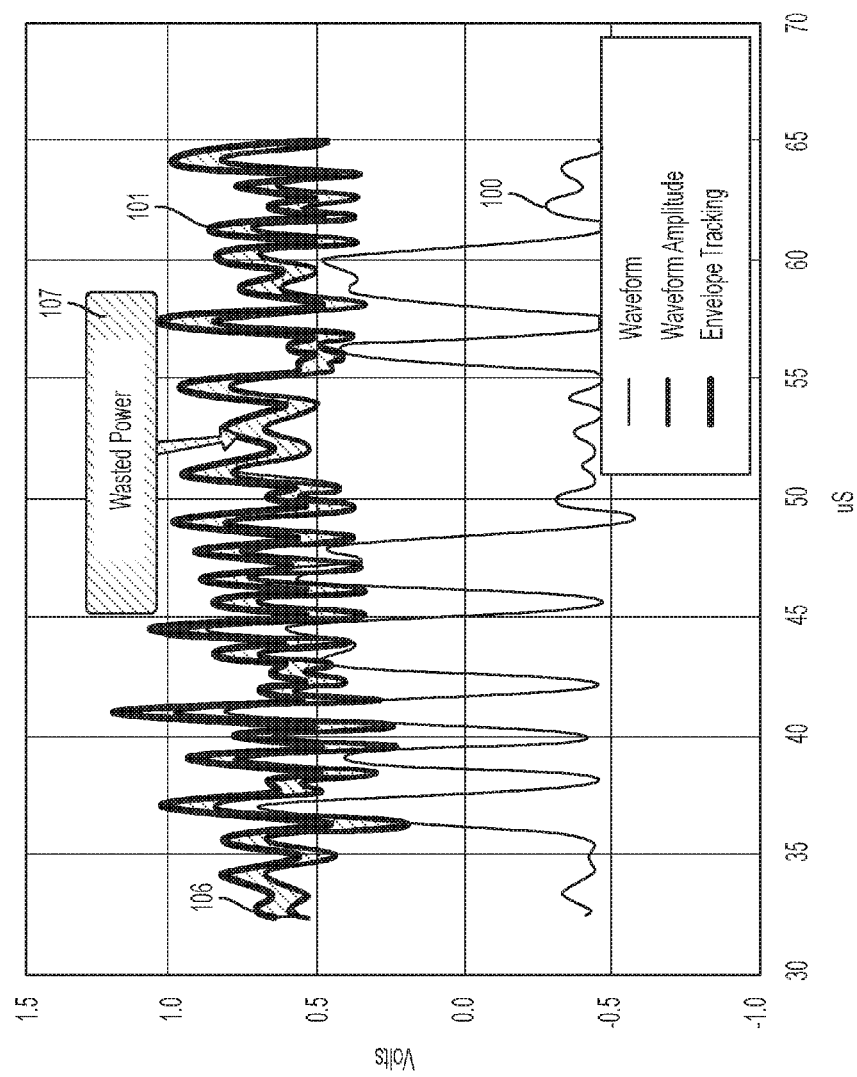
FIG. 5 is a graph showing a variable power supply signal and wasted power relative to the magnitude and time-domain signal of FIG. 2.
Figure 6:
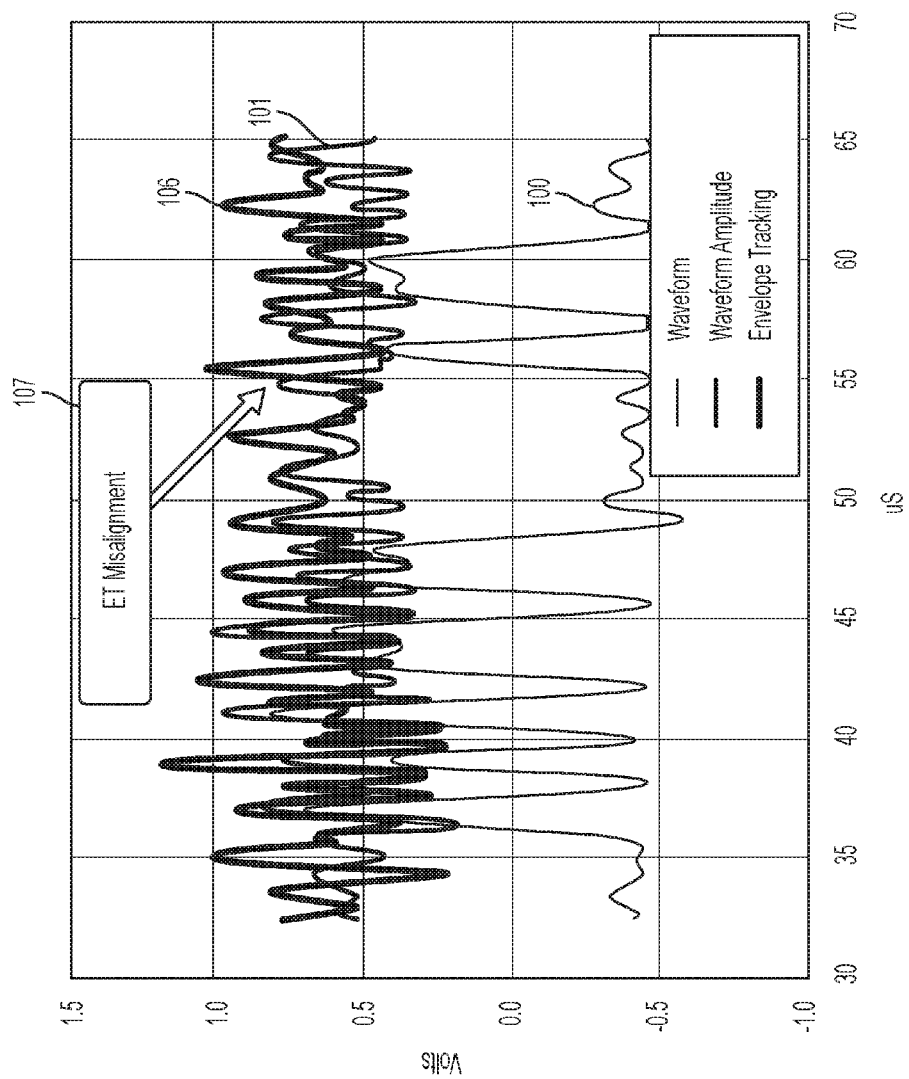
FIG. 6 is a graph showing envelope misalignment of the variable power supply signal and magnitude signal of FIG. 5.

Referring to FIG. 6, as explained above, misalignment between the envelopes of signals 101, 106 can result in inefficient operation. Aligning the envelopes, and thus the signals, is sometimes referred to as envelope tracking (ET). In this example, envelope tracking includes using a variable power supply to deliver instantaneously required power for a signal amplitude, plus a predefined extra amount of power. As a result, in some cases, less power is wasted at any moment of time. A consideration in envelope tracking is the possibility of clipping a signal. More specifically, in some cases, a variable power supply is used to provide the amount of power that a controller determines that a communication device producing the communication signal needs at any point in time. The possibility, however, exists that the controller may be wrong about the amount of power required at some point or points in time. If more power than expected is needed, the excess power is wasted and efficiency degrades, as noted. However, if less power is supplied than is needed, the signal is clipped or, in RF terms, compressed. This clipping causes spectral spreading, which can cause the communication device to fail Adjacent Channel Power Rejection (ACLR) tests. When the device is incorporated into a final product such as a cell phone this clipping induced spectral spreading may also cause unwanted interference into other electronic equipment through adjacent channel interference.

An example of clipping is shown in FIG. 6. More specifically, in FIG. 6, the envelope of that RF signal 101 is misaligned relative to a variable power signal 106. That misalignment, an example of which is shown at point 107, can result in signal clipping. That is, at point 107, the signal magnitude exceeds provided power, resulting in insufficient power to support the signal and, thus, a clipped (or missing) part of the signal. In this example, the misaligned envelope tracking waveform clips some samples of the signal significantly, and others negligibly or not at all. The clipped samples may be small amplitudes as well as large amplitudes. This clipping causes spectral spreading, which may result in a communication device failing an ACLR test, as noted. In some implementations, time alignment accurate to within a nanosecond may be needed pass ACLR; however, in other implementations, different levels of accuracy may be required. The techniques described herein may be used to implement time alignment at a level of a nanosecond or less. More generally, the techniques described herein may be used to implement time alignment for a signal that is sampled at a clock period; and to time-shift that signal at an amount that is less than that sample clock period. The techniques described herein may also be used to implement time alignment for a signal that is sampled at a clock period; and to time-shift that signal at an amount that is greater than that sample clock. More generally, the techniques described herein may be used to implement time alignment for a signal that is sampled at a clock period, and to time-shift that signal a desired amount ranging from any appropriate clock period to a small fraction of a clock period.

Figure 7:
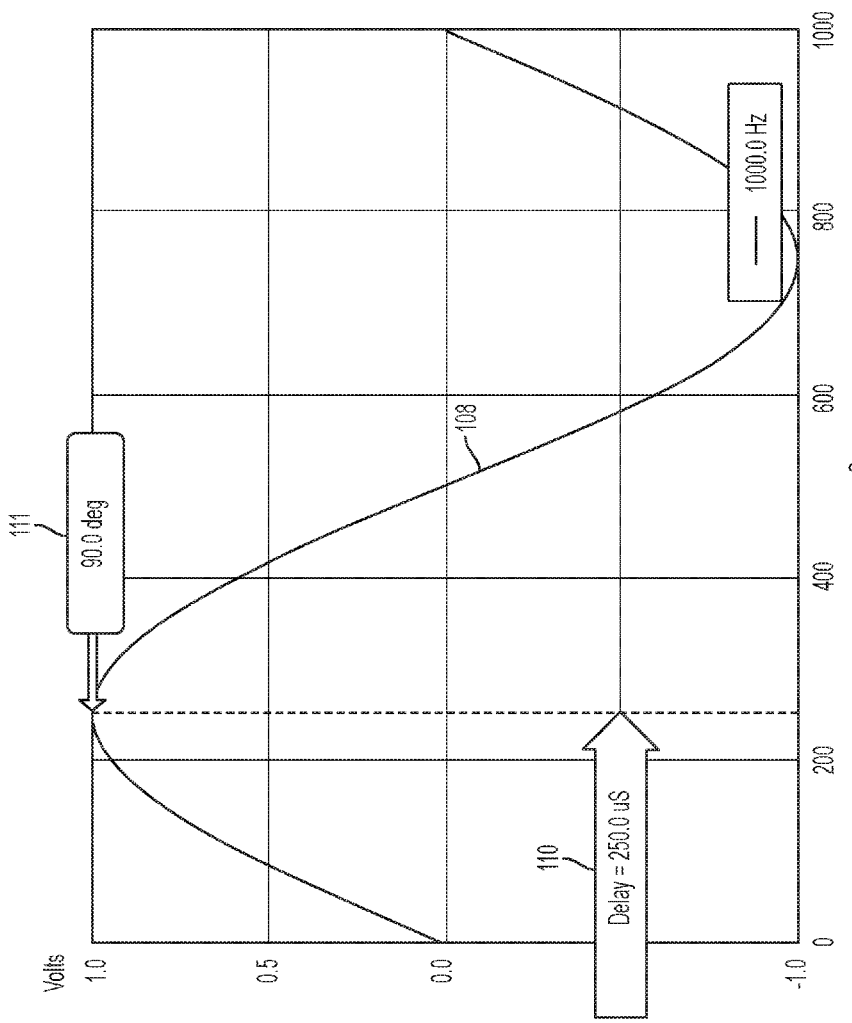
FIG. 7 is a graph showing an example time-domain signal illustrating application of phase-shifting to implement time-shifting.

As noted above, the techniques described herein may be used to time-shift any single signal or any appropriate number of multiple signals. FIG. 7 shows an example of a sinusoidal signal 108 that is phase-shifted in order to delay signal 108 in time. In an example, sinusoidal signal 108 may be a component of a larger communication signal that is obtained by performing a frequency-domain analysis on the communication signal. Examples of frequency-domain analyses that may be performed to obtain sinusoidal signal component(s) of a communication (or other) signal include, but are not limited to, the following: a discrete Fourier transform (DFT), a fast Fourier transform (FFT), a Galois transform, a Cosine transform, or a ChirpZ transform.

As indicated above, in some implementations of automatic test equipment (ATE), time (e.g., envelope) alignment of signals to within a nanosecond may be needed for a communication device under test (DUT) to pass ACLR testing. In example ATE, a first time-domain signal representing a communication signal is generated by an arbitrary waveform generator (AWG), and a second time-domain signal representing the variable power signal is also generated by an AWG. In an example implementation, the first time-domain signal passes through a different electrical pathway than the second time-domain signal resulting in a time difference between the envelope of the first time-domain signal and the envelope of the second time-domain signal (e.g., a variable power signal or representation thereof) that may be mitigated by the techniques described herein. Even when the first and second time-domain signals start at the same time, due to time-of-travel differences through ATE in-system cabling and device interface board (DIB) circuitry, the signals' envelopes will be misaligned by the time that the signals reach a communication device being tested by the ATE. The techniques described herein may be performed to more closely align the envelope of the first time-domain signal with the envelope of a second time-domain signal.

For a continuous sinusoid, such as sinusoid 108 of FIG. 7, a time-shift is equivalent to a corresponding phase-shift. In the example of FIG. 7, a 1 KHz (kiloHerz) sinusoidal signal 108 is to be time-shifted (in this example, delayed) by 250 µs 110. A 1 KHz sinusoidal signal has a 1 ms (millisecond) period, so the time-shift is ¼ period. A ¼ period of a sinusoid is 90° 111, which equals π/4 radians, so computer code to generate the sinusoidal signal includes a π/4 phase-shift to be applied to the sinusoidal signal. The example techniques are not limited by the rate of the clock used to sample the signals to perform the computations to implement the phase-shift. In some implementations, for example, it may be possible to provide a better than femtosecond alignment resolution.

Figure 8:
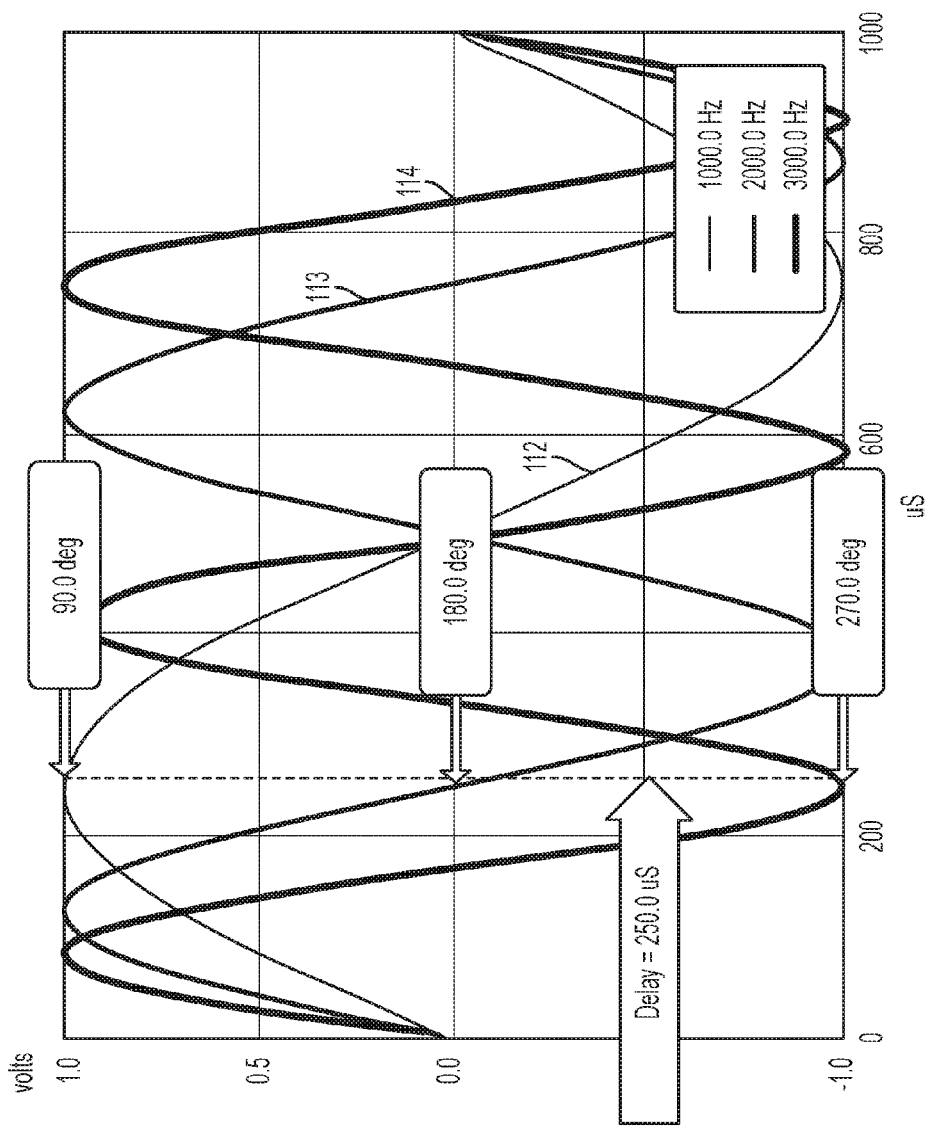
FIG. 8 is a graph showing first, second and third harmonics of the time-domain signal of FIG. 7 to illustrate application of phase-shifting to implement time-shifting.

Sinusoidal signal 108 may represent the first harmonic of a communication signal. Each frequency harmonic following the first harmonic is an integer times a frequency of the first harmonic. So, for each harmonic, the phase-shift is a phase-shift of the first harmonic times the integer. Thus, the phase-shift required for a given time-shift is frequency dependent. In FIG. 8 are shown the first three harmonics of the 1 KHz sinusoid: 1 KHz 112, 2 KHz 113, and 3 KHz 114. To obtain the same 250 µs time-shift for each of the harmonics, the phase-shifts for each of the harmonics are as follows 90° (π/2 phase-shift), 180° (π phase-shift), and 270° (3*π/2 phase-shift). In this example, since the frequencies are integer multiples of π/2 (e.g., 1*π/2, 2*π/2, 3*π/2, respectively), the required phase-shifts are integer multiples as well.

Figure 9:
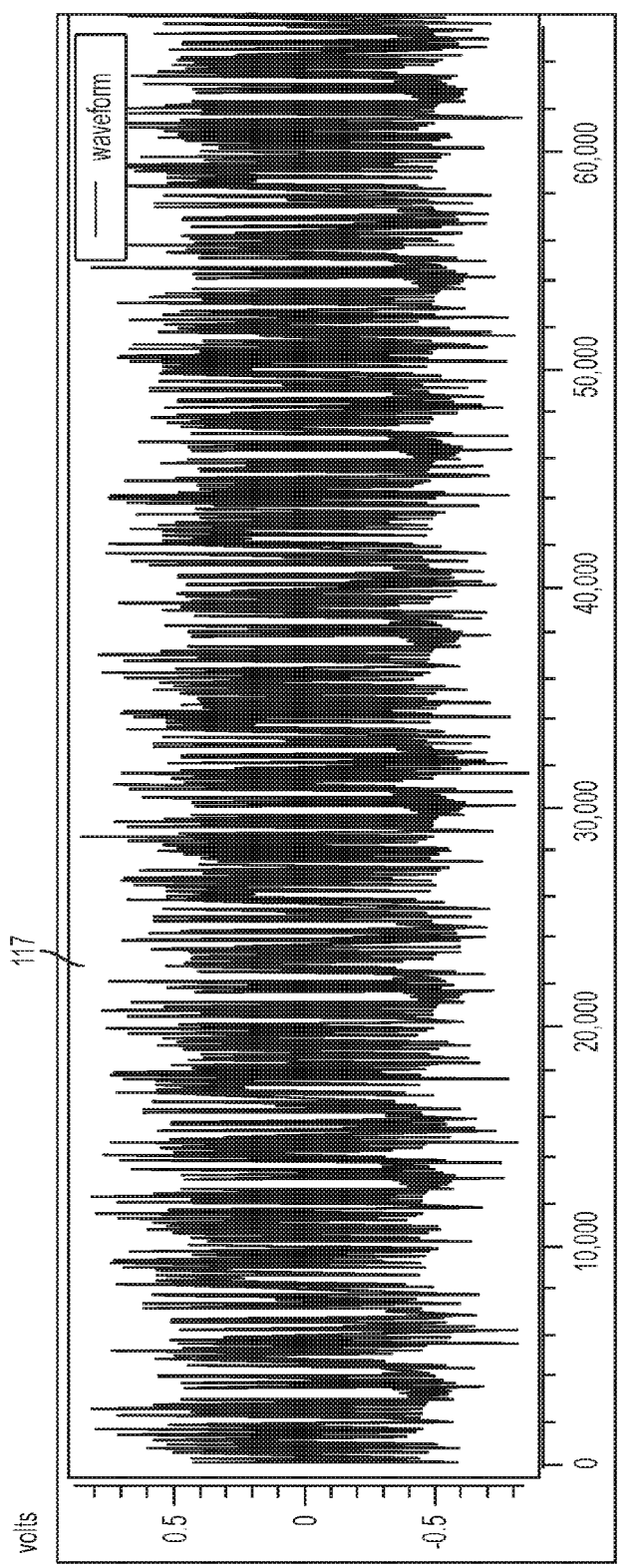
FIG. 9 is graph showing an example composite time-domain signal.

A composite waveform, such as waveform 117 of FIG. 9, may be represented by various sinusoidal signals, including, e.g., those shown in FIG. 8. A frequency-domain analysis (e.g., an FFT) may be performed on the composite waveform to obtain its component frequency-domain sinusoidal signals; those component frequency-domain sinusoidal signals may be phase-shifted appropriate amount(s) to achieve a specified time-shift; and the resulting phase-shifted frequency-domain sinusoidal signals may be converted back to the time-domain (e.g., by performing an inverse FFT on the signals). In an example implementation, sinusoidal signals are obtained from a more complex time-domain (e.g., communication) signal by performing an FFT of the time-domain signal. The sinusoidal signals are phase-shifted a specified amount to more closely align to a variable power signal (e.g., to achieve alignment to within a specified tolerance). An inverse FFT is performed on the phase-shifted signals to produce a time-domain signal with a magnitude having an envelope that tracks the envelope of the variable power signal more closely than does the envelope of the magnitude of the original time-domain signal, resulting in an improved ACLR test result, or a reduction in adjacent channel leakage in the final product.

In an example implementation, the FFT separates a signal into its component sinusoidal signals. The magnitudes and frequency phases are extracted via the FFT, and the frequencies are phase-shifted to achieve the required time-shift. That is, phase-shifting is applied to (e.g., phase is added to or subtracted from) the individual component sinusoidal signals to produce a specified time-shift of the original signal. Then, the original magnitudes are combined with the shifted phases, and an inverse FFT is performed to obtain a version of signal that is time-shifted (e.g., delayed or advanced) in the time-domain.

To determine the phase shift of all of the component sinusoids produced by the FFT, the phase shift of the FFT's Fourier frequency is determined. The Fourier frequency of the time-domain signal is an inverse of an acquisition time (e.g., the sampling time of the whole captured waveform) of the time-domain signal. Since all of the sinusoids in the FFT are integer (bin number) multiples of the Fourier frequency, it is possible to create a ramp function comprised of steps and having a slope that is based on the desired phase shift of the Fourier frequency. Each consecutive step of the ramp function is the bin number times the phase delay of each signal. The ramp is thus comprised of the phase-shifts to be applied to each component signal of the Fourier transform of the original time-domain signal. In some implementations, each step of the ramp function has an equal length; however, that need not be the case.

As noted above, the component sinusoidal signals are associated with bins, each of which has a bin number. Each bin number increments by one for a successive sinusoidal signal. A phase-shift for each sinusoidal signal is represented as a product of two (2), pi (π), the time-shift (TimeShift), and the bin number (BinNumber) divided by a total period of the first time-domain signal. These phase may be combined to generate a ramp function to be applied to corresponding sinusoidal signals in order to delay the phases of those sinusoidal signals, as described herein.

Figure 10:
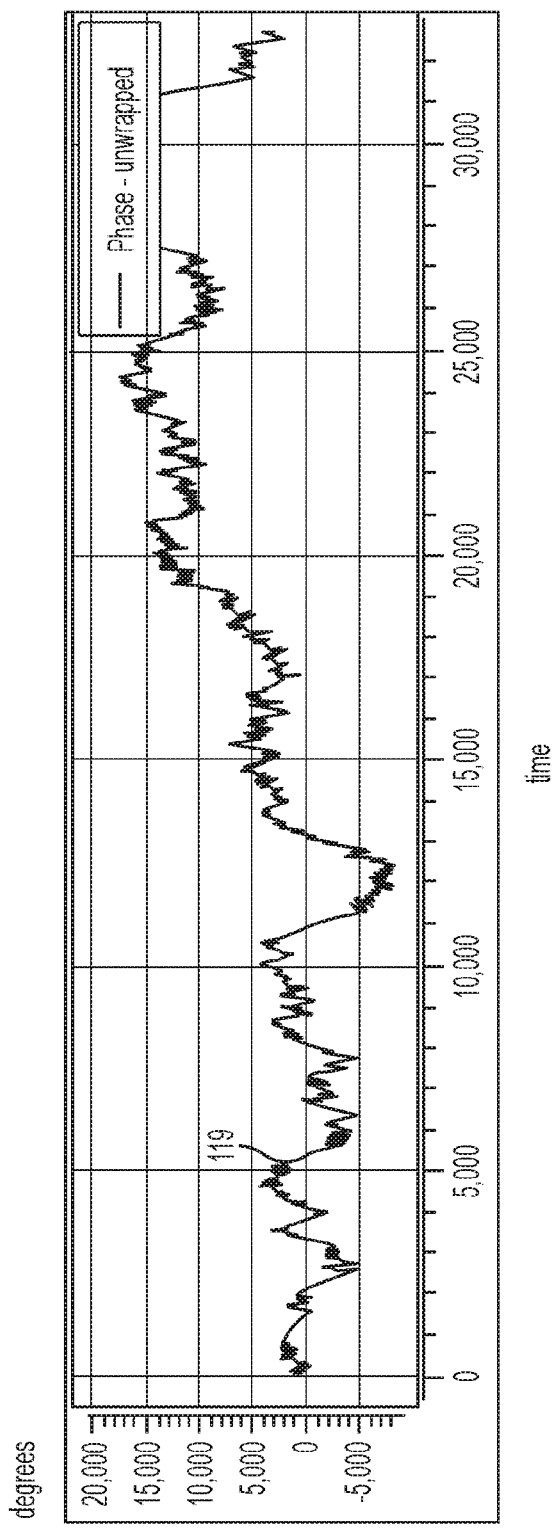
FIG. 10 is a graph showing unwrapped phases of the signal of FIG. 9.

FIG. 10 is a graph showing unwrapped phases 119 of the signal 117 of FIG. 9 versus time. Phase is usually plotted wrapped at +/−π. So, if a signal is trending positively toward +π (e.g., 180°), then the next sample that would occur at, e.g., +181°, would instead be plotted at −179°, keeping all sample points within the base cycle. Unwrapping the phase lets the +181° sample graph at +181°, etc. so that, as the signal evolves, the phase may accumulate to larger angles.

Figure 11:
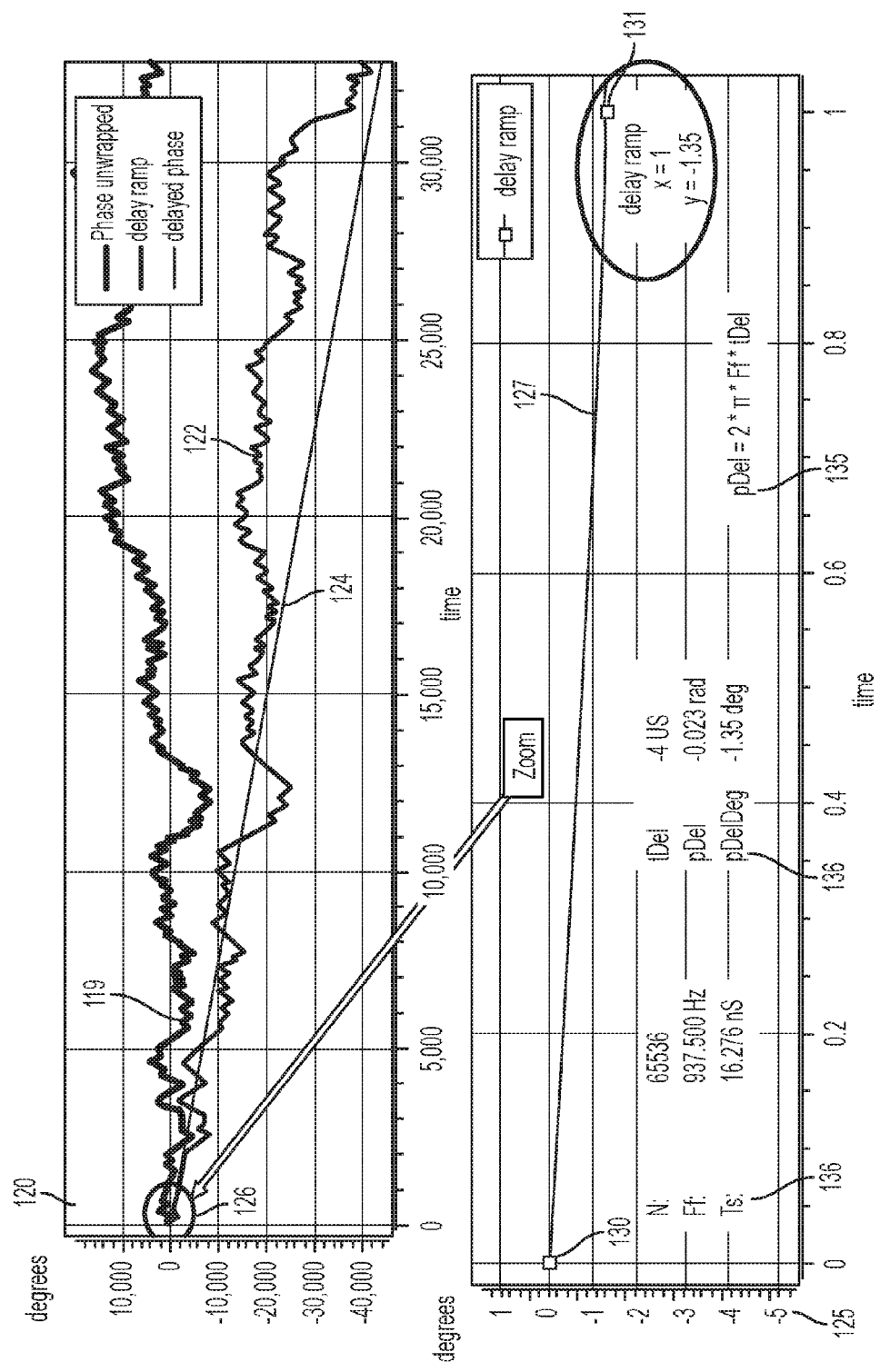
FIG. 11 includes two graphs: one showing the unwrapped phases of FIG. 10 time-shifted using a ramp function; and one showing a close-up area time-shifted.

FIG. 11 includes a graph 120 showing the unwrapped phases 119 of FIG. 10, and an unwrapped phase signal 122 after combination with the ramp function 124 generated as described herein. In the example of FIG. 11, the time-shift is a 4 μs delay, and the unwrapped phase signal 122 is produced by summing the ramp function 122 and the unwrapped phase signal 119. Graph 125 shows area 126 of graph 120 magnified ("zoomed") containing the first two samples 130, 131 of the graph 120, but only shows part 127 of ramp function 124. Ramp function 127 starts at (0,0), and the next point is at (1,−1.35), with the "Y" axis in degrees. The phase-shift in radians (pDel, −0.023 radians) is the increment value determined by equation 135 using values 136, where Ff is the Fourier frequency, tDel is the time delay, pDelDeg is the time-shift in degrees, N is the number of samples in waveform 117, and Ts is the sampling rate. An inverse FFT of the time-shifted signal produces a time-domain waveform time-shifted by 4 μs.

Figure 12:
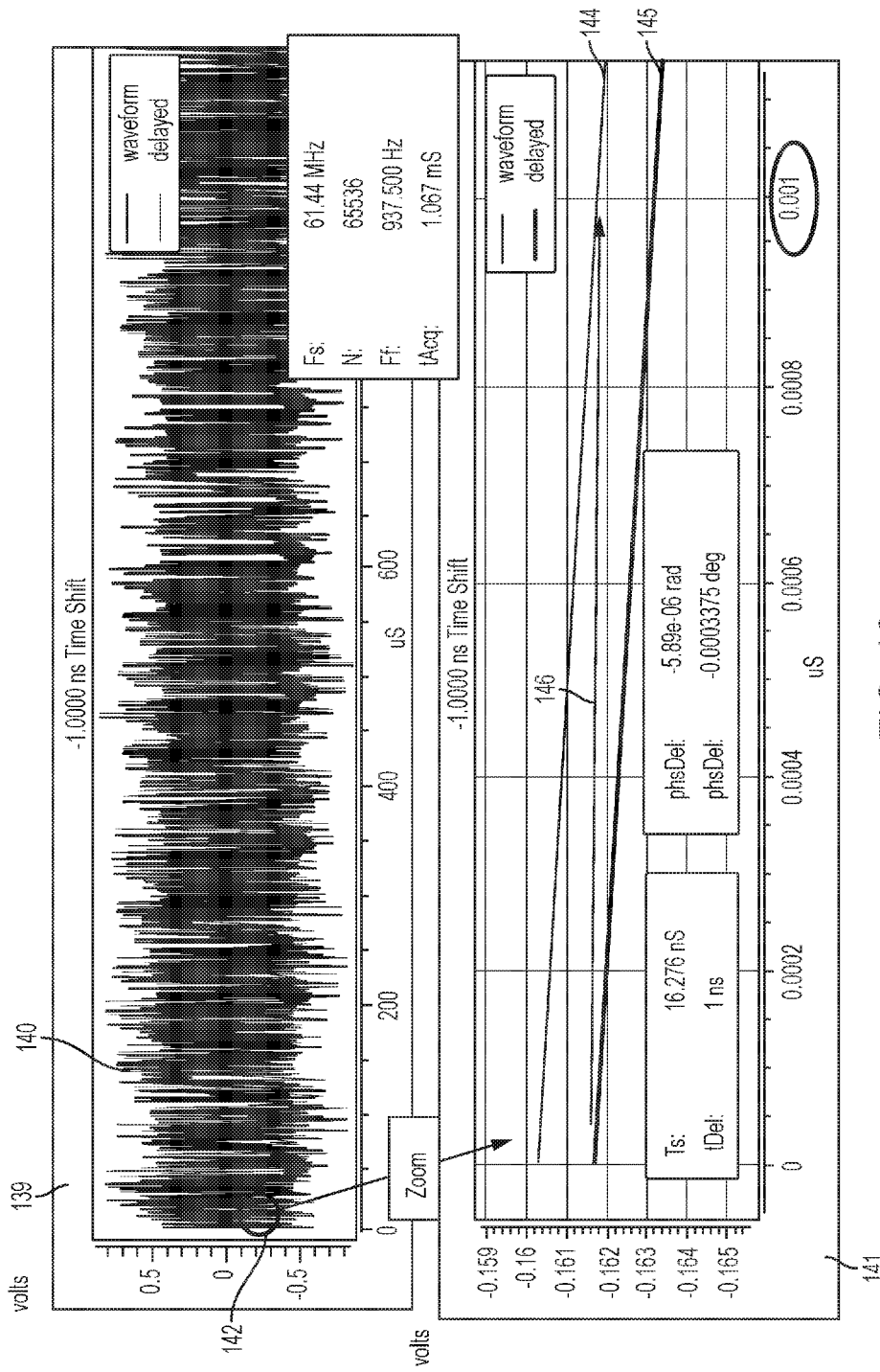
FIG. 12 includes two graphs: one showing a composite time-domain signal; and one showing a close-up area of the composite time-domain signal time-shifted.

FIG. 12 shows a graph 139 showing a waveform 140 delayed by 1 ns. In the magnified bottom graph 141 of part 142 of graph 139, the voltage of the delayed waveform 144 at 1 ns (0.001 μs) is the same as the original waveform 145 at 0 ns, as evidenced by arrow 146. Both are at −0.1617 volts reflecting an accurate time delay of 1 ns (0.001 μs) even though the sampling rate is 16.276 ns per sample in this example.

Figure 13:
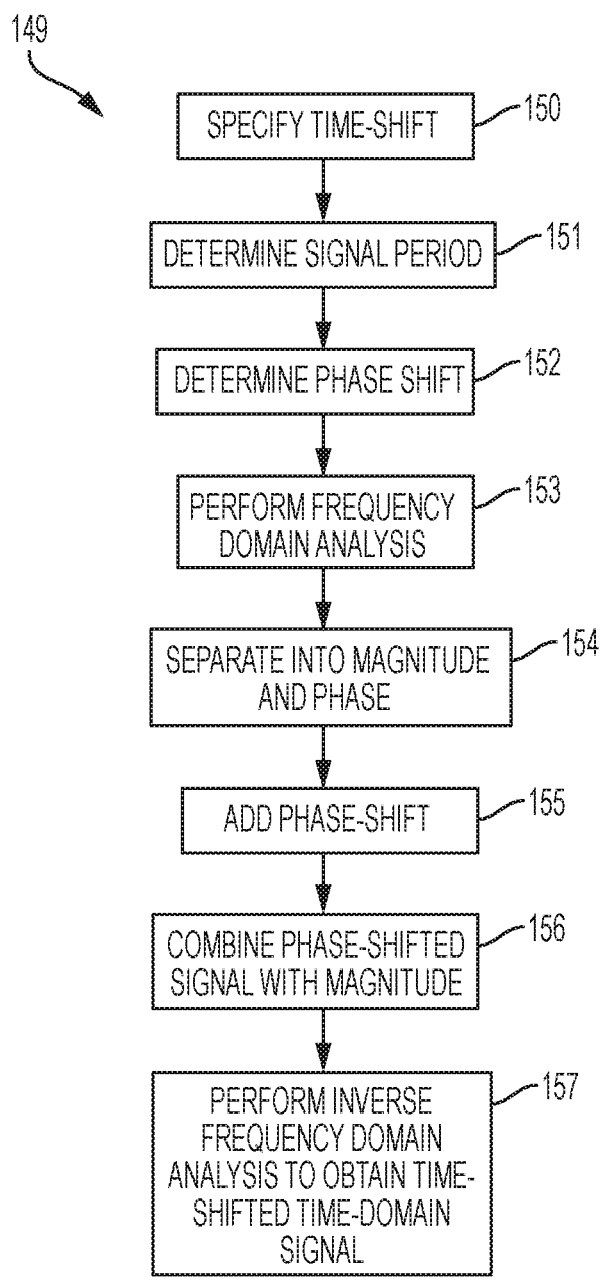
FIG. 13 is a flowchart showing an example process for time-shifting signals.

FIG. 13 is a flowchart showing an example process 149 that implements the time-shifting techniques described herein. According to process 149, a desired time-shift (TimeShift) is specified (150) for a given signal, such as signal 117 of FIG. 9. The period (Tperiod) of that signal is determined (151). The phase-shift to implement the input time-shift is determined (152) as follows: 2*π*TimeShift/Tperiod. A frequency-domain analysis of the given signals is performed (153). For example, an FFT of the given signal may be performed to produce sinusoidal components of that signal. The sinusoidal components are separated (154) into magnitude and phase components in this example, and the phase components processed separately. The appropriate phase-shift is then added (155) to each phase component, for example, using the ramp function described herein (e.g., the phase-shift of each component is multiplied by the bin number, and the result added to the phase component). The resulting phase-shifted signal is then combined (156) with the original magnitudes to produce a new frequency domain signal. An inverse of the frequency-domain analysis (e.g., an inverse FFT) is then performed (157) on the new FFT to signal to produce a time-domain signal that is shifted in time by the desired time-shift (TimeShift).

Figure 14:
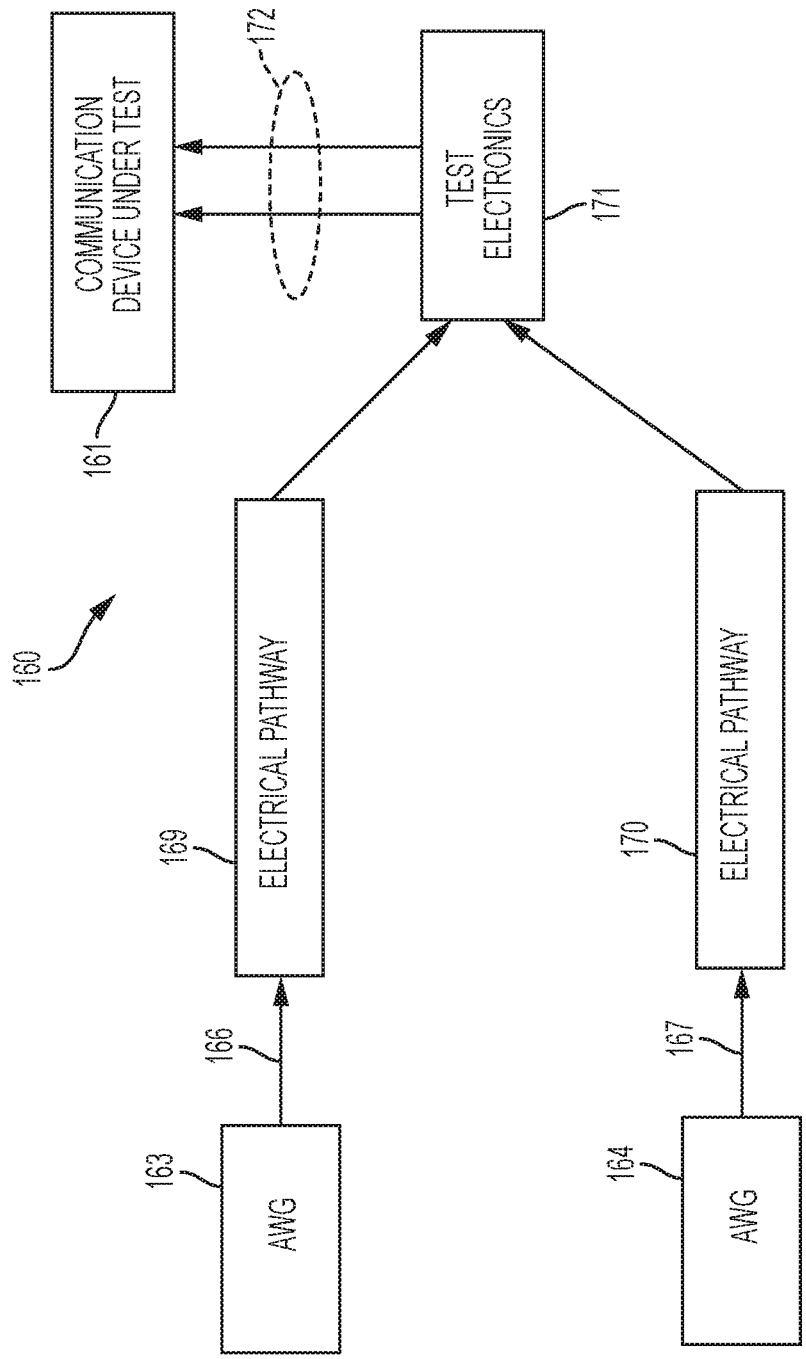
FIG. 14 is a block diagram of components of example automatic test equipment.

FIG. 14 shows an example of automatic test equipment (ATE) 160 that may be used to perform tests, such as ACLR tests, on a communication device 161. ATE 160 includes first and second AWGs 163, 164 for generating first and second time-domain signals 166, 167, one of which represents, for example, a communication signal and one of which represents a variable power signal. The time-domain signals may, for example, through different electrical pathways 169, 170 resulting in a difference between the envelopes of the time-domain signals. Test electronics 171, which may include one or more processing devices, such as a digital signal processor, performs the techniques described herein to time-align the first and second time-domain signals. As explained above, the processing device(s) execute instructions to obtain information (e.g., data) representing sinusoidal signals comprising components of a first time-domain signal (obtained, e.g., through frequency-domain analysis); and to process the information to shift phases of the sinusoidal signals by amounts corresponding to a specified time-shift to produce phase-shifted signals, which are then converted to the time-domain. The resulting time-shifted signals 172 may be used for further testing of the communication device. In other implementations, the time-shifting techniques described herein may be used outside the context of test, and outside the context of communication signals.

Testing performed by the example test system described herein may be implemented using hardware or a combination of hardware and software. For example, a test system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The techniques described herein may be performed by automatic test equipment or any other appropriate computing device. The techniques can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a wired or wireless connection that includes intervening components but that nevertheless allows electrical signals to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A method comprising:
    obtaining sinusoidal signals comprising components of a first time-domain signal;
    shifting phases of the sinusoidal signals by amounts corresponding to a specified time-shift to produce phase-shifted signals, wherein shifting the phases is performed to more closely align an envelope of the first time-domain signal with an envelope of a second time-domain signal, and wherein the second time-domain signal comprises a variable power signal; and
    converting the phase-shifted signals to time domain signals having the specified time-shift;
    wherein the sinusoidal signals comprise a first harmonic and additional harmonics, each additional harmonic corresponding to an integer times a frequency of the first harmonic; and
    wherein, for each additional harmonic, a phase-shift corresponds to a phase-shift of the first harmonic times the integer.

2. The method of claim 1, wherein obtaining the sinusoidal signals comprises performing a frequency-domain analysis of the first time-domain signal.

3. The method of claim 2, wherein the frequency-domain analysis comprises of a discrete Fourier transform.

4. The method of claim 2, wherein the frequency-domain analysis comprises one of a Galois transform, a Cosine transform, or a ChirpZ transform.

5. The method of claim 1, wherein obtaining the sinusoidal signals comprises performing a fast Fourier transform of the first time-domain signal to produce the sinusoidal signals;
    wherein the variable power signal is produced by a variable power supply; and
    wherein converting comprises performing an inverse fast Fourier transform on the phase-shifted signals to produce a third time-domain signal having an envelope that tracks the envelope of the variable power signal more closely than does the envelope of the first time-domain signal resulting in a reduction of wasted power from the variable power supply.

6. The method of claim 1, wherein shifting phases of the sinusoidal signals by amounts corresponding to a specified time-shift comprises delaying the phases of the sinusoidal signals by the amounts.

7. The method of claim 1, wherein shifting phases of the sinusoidal signals by amounts corresponding to a specified time-shift comprises advancing the phases of the sinusoidal signals by the amounts.

8. The method of claim 1, wherein the sinusoidal signals are associated with bins, each of the bins having a bin number that is based on the integer;
    wherein a Fourier frequency of the time-domain signal is an inverse of an acquisition time of the time-domain signal; and
    wherein shifting phases of the sinusoidal signals comprises:
        generating a ramp function having a slope that corresponds to a phase delay of the Fourier frequency, the ramp function comprising steps in which each step of the ramp function corresponds to a product of the bin number and the phase delay; and
        combining the ramp function with phases of the sinusoidal signals to produce the phase-shifted signals.

9. The method of claim 8, wherein each step has an equal length.

10. The method of claim 1, wherein the first time-domain signal has an associated sample clock period; and
    wherein the specified time-shift is less than the sample clock period.

11. The method of claim 1, wherein the first time-domain signal has an associated sample clock period; and
    wherein the specified time-shift is more than the sample clock period.

12. The method of claim 1, wherein the sinusoidal signals are two signals.

13. The method of claim 1, wherein the sinusoidal signals comprise more than two signals.

14. The method of claim 1, wherein the first time-domain signal is generated by a first waveform generator.

15. The method of claim 14, wherein the second time-domain signal is generated by a second waveform generator.

16. The method of claim 1, wherein the first time-domain signal passes through a different electrical pathway than the second time-domain signal resulting in a difference between the envelope of the first time-domain signal and the envelope of the second time domain signal that is mitigated by the shifting.

17. A method comprising:
    obtaining sinusoidal signals comprising components of a first time-domain signal;
    shifting phases of the sinusoidal signals by amounts corresponding to a specified time-shift to produce phase-shifted signals, wherein shifting the phases is performed to more closely align an envelope of the first time-domain signal with an envelope of a second time-domain signal, and wherein the second time-domain signal comprises a variable power signal; and
    converting the phase-shifted signals to time domain signals having the specified time-shift;
    wherein the sinusoidal signals are associated with bins, each of the bins having a bin number that is based on an integer;
    wherein a phase-shift for a sinusoidal signal corresponds to a product of two, pi, a time-shift for the sinusoidal signal, and a bin number for the sinusoidal signal divided by a total period of the first time-domain signal.

18. One or more non-transitory machine-readable storage devices storing instructions that are executable by one or more processing devices to perform operations comprising:
    obtaining information representing sinusoidal signals comprising components of a first time-domain signal;

processing the information to shift phases of the sinusoidal signals by amounts corresponding to a specified time-shift to produce information representing phase-shifted signals, wherein shifting the phases is performed to more closely align an envelope of the first time-domain signal with an envelope of a second time-domain signal, and wherein the second time-domain signal comprises a variable power signal; and processing the information representing the phase-shifted signals to produce information representing time domain signals having the specified time-shift;

wherein the sinusoidal signals comprise a first harmonic and additional harmonics, each additional harmonic corresponding to an integer times a frequency of the first harmonic; and wherein, for each additional harmonic, a phase-shift corresponds to a phase-shift of the first harmonic times the integer.

19. A system comprising:

one or more processing devices; and one or more non-transitory machine-readable storage devices storing instructions that are executable by the one or more processing devices to perform operations comprising:

obtaining information representing sinusoidal signals comprising components of a first time-domain signal;

processing the information to shift phases of the sinusoidal signals by amounts corresponding to a specified time-shift to produce information representing phase-shifted signals, wherein shifting the phases is performed to more closely align an envelope of the first time-domain signal with an envelope of a second time-domain signal, and wherein the second time-domain signal comprises a variable power signal; and processing the information representing the phase-shifted signals to produce information representing time domain signals having the specified time-shift;

wherein the sinusoidal signals comprise a first harmonic and additional harmonics, each additional harmonic corresponding to an integer times a frequency of the first harmonic; and wherein, for each additional harmonic, a phase-shift corresponds to a phase-shift of the first harmonic times the integer.

20. The one or more non-transitory machine-readable storage devices of claim 18, wherein obtaining the sinusoidal signals comprises performing a fast Fourier transform of the first time-domain signal to produce the sinusoidal signals;

wherein the variable power signal is produced by a variable power supply; and wherein converting comprises performing an inverse fast Fourier transform on the phase shifted signals to produce a third time-domain signal having an envelope that tracks the envelope of the variable power signal more closely than does the envelope of the first time-domain signal resulting in a reduction of wasted power from the variable power supply.

21. The system claim 19, wherein obtaining the sinusoidal signals comprises performing a fast Fourier transform of the first time-domain signal to produce the sinusoidal signals;

wherein the variable power signal is produced by a variable power supply; and wherein converting comprises performing an inverse fast Fourier transform on the phase shifted signals to produce a third time-domain signal having an envelope that tracks the envelope of the variable power signal more closely than does the envelope of the first time-domain signal resulting in a reduction of wasted power from the variable power supply.

\* \* \* \* \*